(12) United States Patent
He et al.

(10) Patent No.: US 9,698,098 B1
(45) Date of Patent: Jul. 4, 2017

(54) ANTI-FUSE STRUCTURE AND METHOD FOR MANUFACTURING THE SAME

(71) Applicant: International Business Machines Corporation, Armonk, NY (US)

(72) Inventors: Hong He; Juntao Li, Cohoes, NY (US); Junli Wang, Slingerlands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/251,490

(22) Filed: Aug. 30, 2016

Related U.S. Application Data

(62) Division of application No. 14/984,062, filed on Dec. 30, 2015, now Pat. No. 9,520,357.

(51) Int. Cl.
*H01L 23/525* (2006.01)

(52) U.S. Cl.
CPC .............................. *H01L 23/5252* (2013.01)

(58) Field of Classification Search
None
See application file for complete search history.

(56) References Cited

U.S. PATENT DOCUMENTS

| | | | |
|---|---|---|---|
| 5,789,795 A | 8/1998 | Sanchez et al. | |
| 6,124,194 A | 9/2000 | Shao et al. | |
| 6,251,710 B1 | 6/2001 | Radens et al. | |
| 6,335,228 B1 | 1/2002 | Fuller et al. | |
| 7,714,326 B2 | 5/2010 | Kim et al. | |
| 7,732,893 B2 | 6/2010 | Iyer et al. | |
| 8,115,275 B2 | 2/2012 | Cestero et al. | |
| 8,736,020 B2 | 5/2014 | Bao et al. | |
| 9,041,151 B2 | 5/2015 | Lavoie et al. | |
| 9,105,637 B2 | 8/2015 | Filippi et al. | |
| 2008/0217658 A1* | 9/2008 | Kim | H01L 23/5252 257/209 |
| 2008/0217736 A1 | 9/2008 | Cestero et al. | |
| 2009/0206446 A1 | 8/2009 | Russ et al. | |
| 2013/0134519 A1 | 5/2013 | Sengoku | |

OTHER PUBLICATIONS

List of IBM Patents or Patent Applications Treated as Related Aug. 30, 2016.

* cited by examiner

*Primary Examiner* — Daniel Whalen
(74) *Attorney, Agent, or Firm* — Vazken Alexanian; Ryan, Mason & Lewis, LLP

(57) ABSTRACT

A method for manufacturing a semiconductor device includes forming a fin extending between first and second pads on a substrate, removing a central portion of the fin to create an opening between a first part of the fin extending from the first pad and a second part of the fin extending from the second pad, growing first and second epitaxial layers in the opening on a side of respective first and second parts of the fin, stopping the growth of the first and second epitaxial layers prior to merging, forming a silicide layer on the first and second pads, first and second parts of the fin and first and second epitaxial layers, wherein there is a gap between portions of the silicide layer on the first and second epitaxial layers in the opening, and depositing a dielectric layer on the silicide layer, filling in the gap.

19 Claims, 6 Drawing Sheets

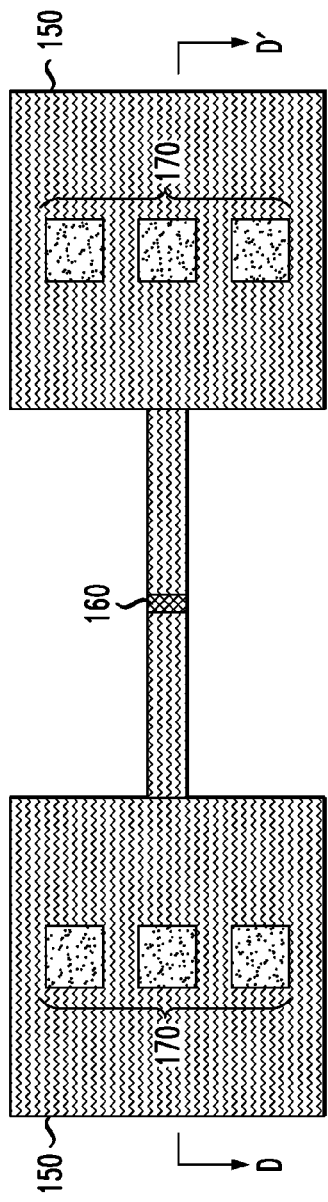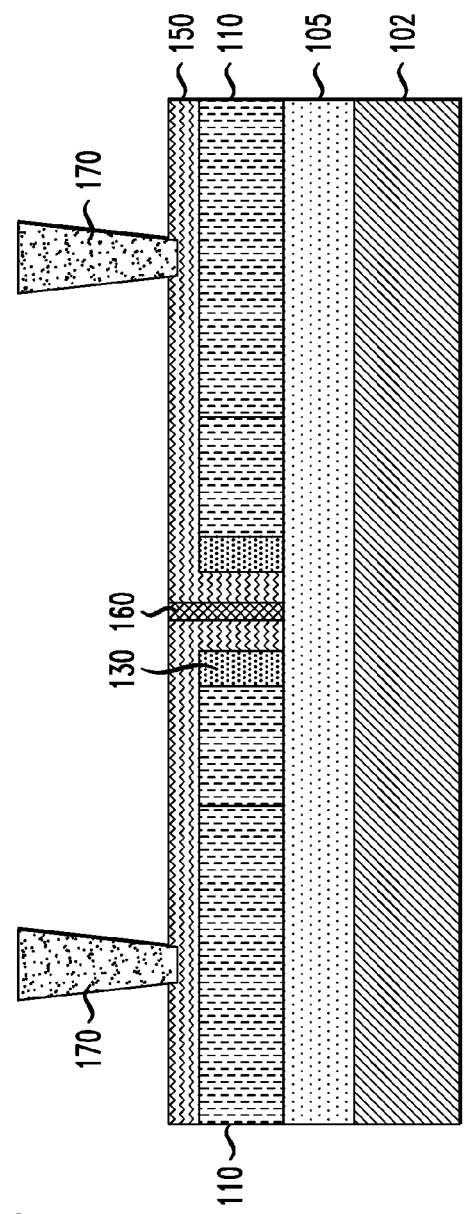
FIG. 7A
FIG. 7B

US 9,698,098 B1

ANTI-FUSE STRUCTURE AND METHOD FOR MANUFACTURING THE SAME

TECHNICAL FIELD

The field generally relates to semiconductor devices and methods of manufacturing same and, in particular, to semiconductor devices having an improved anti-fuse structure.

BACKGROUND

Anti-fuses are commonly used in the semiconductor industry for one-time programming purposes. For example, anti-fuses can be used for updating and repairing in product configurations, such as repairing dynamic random access memory (DRAM) arrays by swapping defective cells with redundant cells.

Anti-fuse structures include a material which initially has a relatively high resistance, but after programming by electrical or optical means (e.g., when a voltage across the anti-fuse structure exceeds a certain level), is converted to a lower resistance material. In order to convert to the lower resistance material, known anti-fuses typically require voltages in excess of an on-chip power supply voltage to break down an insulating region between two conductors. As operating voltages continue to be scaled down, achieving and controlling sufficient anti-fuse programming voltage has become increasingly difficult. Precise electrical and physical control are also required to achieve reliable activation of anti-fuses.

Low processing cost and relatively high chip density are requirements as semiconductor technology continues to be scaled down. However, conventional methods for fabricating and activating known anti-fuses have become increasingly costly and an unattractive option.

SUMMARY

According to an exemplary embodiment of the present invention, a method for manufacturing a semiconductor device includes forming a fin extending between a first pad and a second pad on a semiconductor substrate, removing a central portion of the fin to create an opening between a first part of the fin extending from the first pad and a second part of the fin extending from the second pad, growing a first epitaxial layer in the opening on a side of the first part of the fin and growing a second epitaxial layer in the opening on a side of the second part of the fin, stopping the growth of the first and second epitaxial layers prior to merging of the first and second epitaxial layers, depositing a metal layer on the first and second pads, the first and second parts of the fin and the first and second epitaxial layers, wherein a portion of the opening remains unfilled so that there is a gap between portions of the metal layer on the first and second epitaxial layers in the opening, performing a silicidation process to convert the metal layer into a silicide layer, and depositing a dielectric layer on the silicide layer, wherein the dielectric layer fills in a remaining portion of the opening.

According to an exemplary embodiment of the present invention, a semiconductor device includes a substrate, a first pad and a second pad on the substrate, wherein the first and second pads are spaced apart from each other, a first fin part on the substrate and extending from the first pad in a direction toward the second pad, a second fin part on the substrate and extending from the second pad in a direction toward the first pad, first and second epitaxial layers on the substrate and respectively extending from and positioned between the first and second fin parts, first and second silicide layers on the substrate and respectively on each of the first and second epitaxial layers and positioned between the first and second fin parts, a gap between the first and second silicide layers, and a dielectric layer on the substrate and filling the gap between the first and second silicide layers.

According to an exemplary embodiment of the present invention, a method for manufacturing a semiconductor device includes forming a fin extending between a first pad and a second pad on a semiconductor substrate, removing a central portion of the fin to create an opening between a first part of the fin extending from the first pad and a second part of the fin extending from the second pad, growing a first epitaxial layer in the opening on a side of the first part of the fin and growing a second epitaxial layer in the opening on a side of the second part of the fin, stopping the growth of the first and second epitaxial layers prior to merging of the first and second epitaxial layers, forming a silicide layer on the first and second pads, the first and second parts of the fin and the first and second epitaxial layers, wherein a portion of the opening remains unfilled so that there is a gap between portions of the silicide layer on the first and second epitaxial layers in the opening, and depositing a dielectric layer on the silicide layer, wherein the dielectric layer fills in the gap.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIGS. 7A and 7B are respective top and cross-sectional views illustrating removal of part of the dielectric layer and formation of contacts, according to an exemplary embodiment of the present invention.

DETAILED DESCRIPTION

Figure 1A:
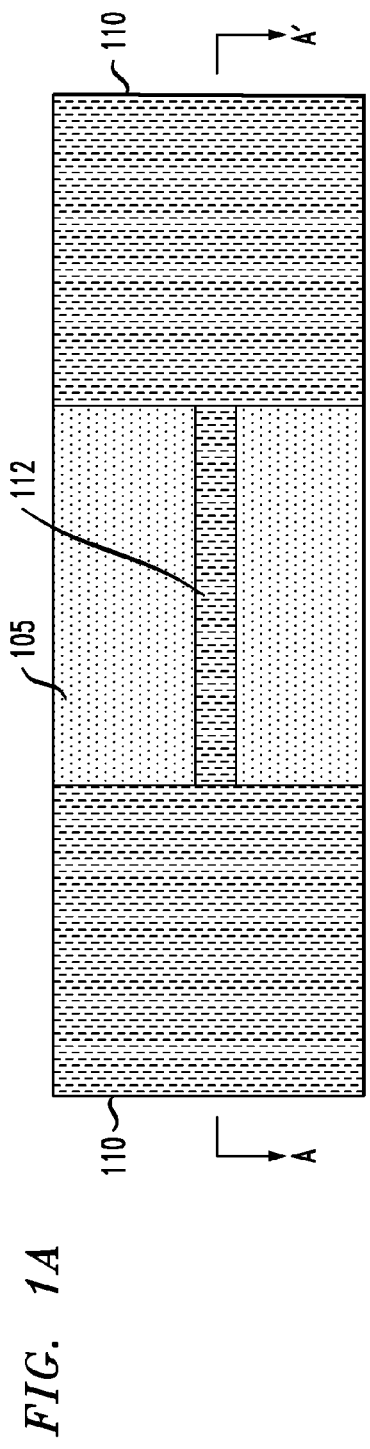
FIGS. 1A and 1B are respective top and cross-sectional views illustrating patterning of a fin with pads on either side of the fin, according to an exemplary embodiment of the present invention.

Exemplary embodiments of the invention will now be discussed in further detail with regard to semiconductor devices and methods of manufacturing same and, in particular, to semiconductor devices having an improved anti-fuse structure.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), programmable logic devices (PLDs), programmable gate arrays, programmable read-only memory (PROM) devices, including, but not limited to, erasable programmable read-only memories (EPROMS), electronically erasable programmable read-only memories (EEPROMS), and/or other semiconductor devices in which anti-fuses may be used, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, FinFETs, PLDs, programmable gate arrays, PROMS, EPROMS, and/or EEPROMS. By way of non-limiting example, the semiconductor devices can include, but are not limited to CMOS, MOSFET, FinFET, PLD, programmable gate array, PROM, EPROM, and EEPROM devices, and/or semiconductor devices that use CMOS, MOSFET, FinFET, PLD, programmable gate array, PROM, EPROM, and/or EEPROM technology.

As used herein, "vertical" refers to a direction perpendicular to a substrate in top and cross-sectional views.

As used herein, "horizontal" refers to a direction parallel to a substrate in top and cross-sectional views.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the top and cross-sectional views.

As used herein, "width" or "length" refers to a size of an element (e.g., a layer, trench, hole, etc.) in the figures measured from a side surface to an opposite surface of the element.

When compared with known anti-fuse structures, embodiments of the present invention provide smaller and more easily activated (e.g., more easily programmed) anti-fuse structures and improved methods for making anti-fuse structures. The embodiments of the present invention are compatible with current process of record (POR) FinFET processes. A proposed processes for manufacturing an anti-fuse structure, in accordance with an embodiment of the present invention, is performed compatibly with a current process flow, and does not require extra masks or extra materials. The anti-fuse structure in accordance with an embodiment of the present invention is more compact and area efficient than conventional structures, and can be easily integrated with the front end devices. Additionally, the anti-fuse structure in accordance with an embodiment of the present invention provides more precise electrical and physical control than conventional structures when manufacturing, activating and/or programming the anti-fuse structure.

Unlike conventional structures, the anti-fuse structure, according to an embodiment of the present invention, provides a vertical and thin insulating gap between two metal electrodes, which can be easily modified according to design constraints by adjusting epitaxial growth conditions.

Figure 1B:
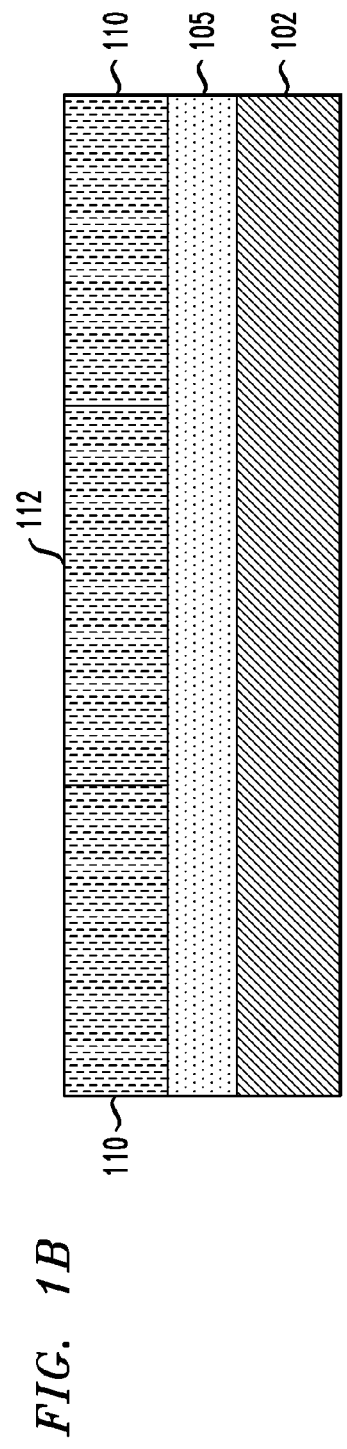

FIGS. 1A and 1B are respective top and cross-sectional views illustrating patterning of a fin with pads on either side of the fin, according to an exemplary embodiment of the present invention. FIG. 1B is a cross-sectional view taken along line A-A' in FIG. 1A. Referring to FIGS. 1A and 1B, a semiconductor substrate 102 can be, for example, a silicon-on-insulator (SOI) substrate including a buried insulating layer 105, such as, for example, a buried oxide or nitride layer located on an upper surface of the semiconductor substrate 102. The substrate 102 may include semiconductor material including, but not limited to, Si, SiGe, SiC, SiGeC or other like semiconductor. In addition, multiple layers of the semiconductor materials can be used as the semiconductor material of the substrate. Alternatively, the substrate can be a bulk semiconductor substrate.

In accordance with an embodiment of the present invention, as can be seen in FIGS. 1A and 1B, a fin 112 is patterned on the buried insulating layer 105 between pads 110. In accordance with an embodiment of the present invention, a conductive silicon fin 112 is formed between conductive silicon pads 110 having a larger width between top and bottom surfaces in the top view of FIG. 1A than the silicon fin 112. The silicon fin 112 can be formed by patterning a silicon layer (or a top portion of a bulk substrate if one is used) into the fin 112. Patterning is performed by a method known in the art, including but not limited to, etching, such as, for example, lithography direct patterning. According to an embodiment of the present invention, before lithography steps, a hardmask including, for example, silicon nitride (SiN) can be formed on a silicon substrate. Then, lithography patterning is transferred to the hardmask by a reactive ion etching (RIE) process. After that, another RIE step is performed to etch silicon fins and/or silicon pads. Then the lithography materials can be stripped by, for example, plasma ashing or SPM ($H_2SO_4:H_2O_2$ mixture) solution. As can be understood from the cross-sectional view in FIG. 1B, the fin 112 has the same height above the buried insulating layer 105 as the pads 110. The material of the pads 110 and the fin 112 is not limited to silicon, and can include, but is not limited to, other materials such as silicon germanium (SiGe), Ge or other III-V materials.

Figure 2A:
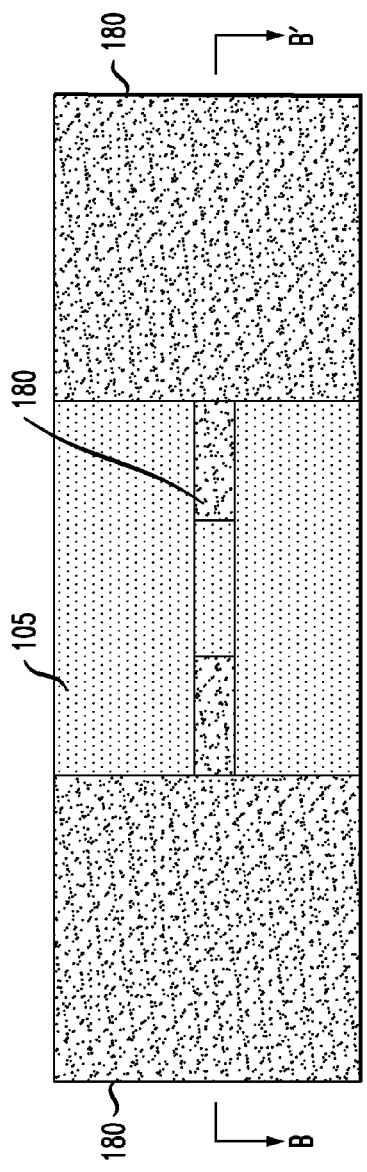
FIGS. 2A and 2B are respective top and cross-sectional views illustrating removal of a central portion of a fin, according to an exemplary embodiment of the present invention.
Figure 2B:
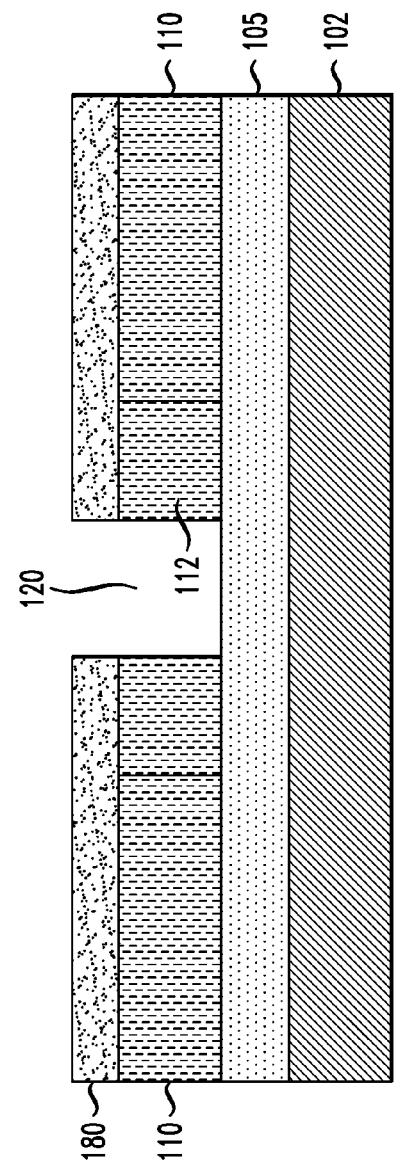

FIGS. 2A and 2B are respective top and cross-sectional views illustrating removal of a central portion of a fin, according to an exemplary embodiment of the present invention. FIG. 2B is a cross-sectional view taken along line B-B' in FIG. 2A. According to an embodiment, a lithography process can be used to result in the removal of the central portion of the fin 112. The lithography can have 3 layers, including, from a top, a photoresist layer, a silicon-containing antireflection coating (SiARC), and an organic planarization layer (OPL). The pattern can be transferred using exposure/development steps from mask to photoresist. Then, RIE steps are used to open the SiARC and OPL.

Referring to FIGS. 2A and 2B, a hardmask 180 including, for example, SiN and covering portions that are not to be removed, and exposing the central portion of the fin 112, is used to remove the central portion of the fin 112 down to the buried insulating layer 105 to form an opening 120. A width of the opening 120 in the left and right directions is approximately 20 nm to approximately 100 nm, and the central portion of the fin 112 can be removed by a method known in the art, including but not limited to, etching, such as, for example, RIE to open the hardmask 180 to the configuration shown in FIGS. 2A and 2B, and then a silicon fin etch stopping at the buried insulating layer 105.

Figure 3A:
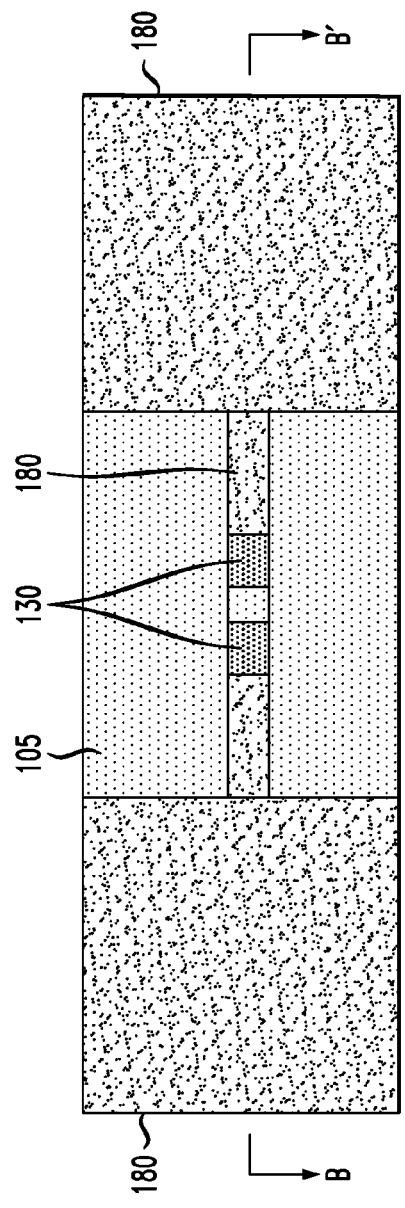
FIGS. 3A and 3B are respective top and cross-sectional views illustrating epitaxial growth of an epitaxial layer on fin sidewalls, according to an exemplary embodiment of the present invention.
Figure 3B:
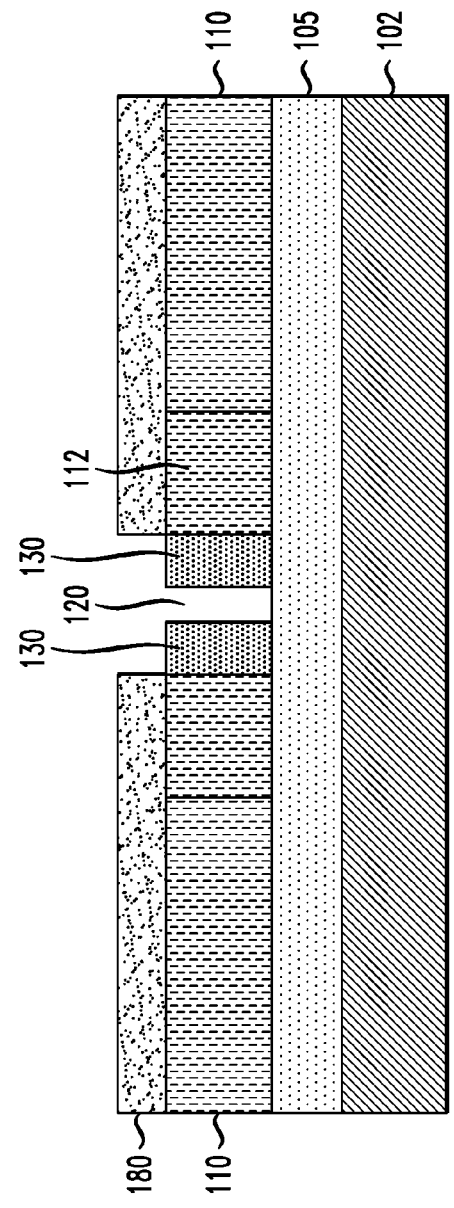

FIGS. 3A and 3B are respective top and cross-sectional views illustrating epitaxial growth of an epitaxial layer on fin sidewalls, according to an exemplary embodiment of the present invention. FIG. 3B is a cross-sectional view taken along line C-C' in FIG. 3A. Referring to FIGS. 3A and 3B, prior to removing the mask from the fin removal steps described in connection with FIGS. 2A and 2B, epitaxial layers 130 are grown on sidewalls of the fin 112 in the opening 120. The mask 180 remains during epitaxial growth in order to limit epitaxial growth to the exposed portions.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

In the case of, for example, a fin 112 including silicon, SiGe can be epitaxially grown on the silicon fin sidewalls. Alternatively, silicon can be epitaxially grown on silicon fin sidewalls. In the case of, for example, a fin 112 including SiGe, SiGe can be epitaxially grown on the SiGe fin sidewalls. Alternatively, silicon can be epitaxially grown on the SiGe fin sidewalls. Depending on the materials of the fins, and design requirements, the embodiments of the present invention are not limited to the combinations described above, and other combinations of fin and epitaxial material are possible.

According to an embodiment, epitaxial growth is stopped prior to merging of the epitaxial layers 130 so that a portion of the opening 120 remains unfilled and there is a gap between left and right epitaxial layers 130. The gap between left and right epitaxial layers 130 in the left and right directions is approximately 2 angstroms to approximately 200 angstroms wide.

The mask 180 from the fin removal steps described in connection with FIGS. 2A and 2B is removed using, for example, an $H_4PO_3$ solution, after the epitaxial growth of layers 130.

Figure 4:
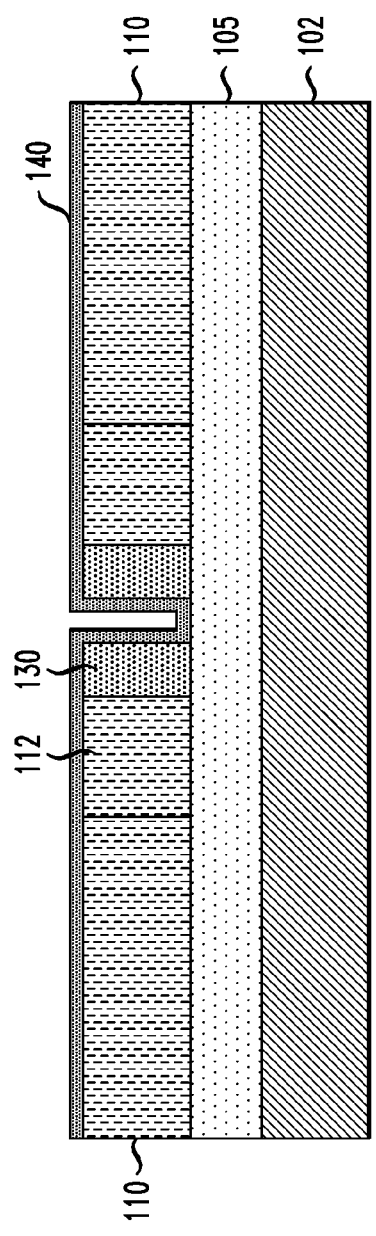
FIG. 4 is cross-sectional view illustrating deposition of a film layer, according to an exemplary embodiment of the present invention.

FIG. 4 is cross-sectional view illustrating deposition of a film layer, according to an exemplary embodiment of the present invention. Referring to FIG. 4, according to an embodiment, a layer 140, for example, a metal film layer, includes a material capable of forming a silicide. The material can include, but is not limited to, metals such as titanium, cobalt, tantalum, and nickel platinum, or combinations thereof. The layer 140 can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition, and/or liquid source misted chemical deposition (LSMCD), sputtering, and/or plating. As shown in FIG. 4, the layer 140 is deposited on exposed portions of the pads 110, fin 112, epitaxial layers 130 and the buried insulating layer 105. According to an embodiment, a height of the layer 140 is such that a portion of the opening 120 remains unfilled and there is a gap between portions of the layer 140 on the left and right epitaxial layers 130. The gap between portions of the layer 140 on the left and right epitaxial layers 130 is approximately 2 angstroms to approximately 200 angstroms wide.

Figure 5:
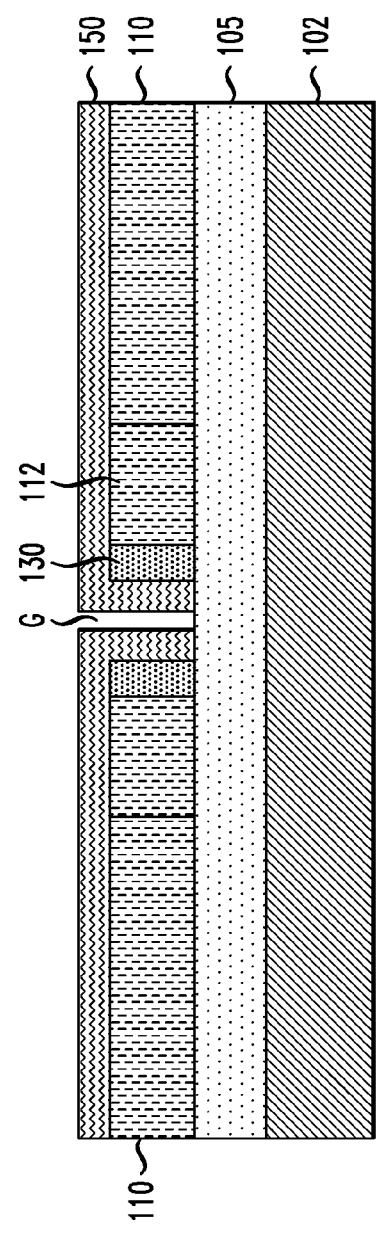
FIG. 5 is cross-sectional view illustrating silicidation of the film layer, according to an exemplary embodiment of the present invention.

FIG. 5 is cross-sectional view illustrating silicidation of the film layer, according to an exemplary embodiment of the present invention. Referring to FIG. 5, a process, such as, for example, an annealing process at approximately 300° C. to approximately 500°, is performed so that the layer 140 reacts with silicon in the pads 110, fin 112 and epitaxial layers 130 to convert the layer 140 into a silicide layer 150 on the pads 110, fin 112 and epitaxial layers 130. The annealing process is not necessarily limited to the temperature range above, and may be performed at other temperatures if required. The silicide layer 150 may include, but is not limited to, nickel silicide (NiSi), nickel platinum silicide ($NiPt_ySi_x$), cobalt silicide ($CoSi_x$), tantalum silicide ($TaSi_x$), titanium silicide ($TiSi_x$) and combinations thereof. As shown in FIG. 5, due to the reaction with the pads 110, fin 112 and epitaxial layers 130, the areas of the pads 110, fin 112 and epitaxial layers 130 is reduced and replaced by the silicide layer 150. Referring to FIGS. 4 and 5, the part of the layer 140 on the buried insulating layer 105 under the gap between the portions of the layer 140 on the left and right epitaxial layers 130 is removed by, for example, an etching process, such as a wet etch, since that part of the layer 140 does not react with the buried insulating layer 105 and is not converted to a silicide during the annealing process. As shown in FIG. 5, due to the gap G separating the left and right portions of the silicide layer 150, the silicide layer may also be characterized as a first silicide layer and a second silicide layer separated by a gap. The gap G is approximately 2 angstroms to approximately 200 angstroms wide.

Figure 6:
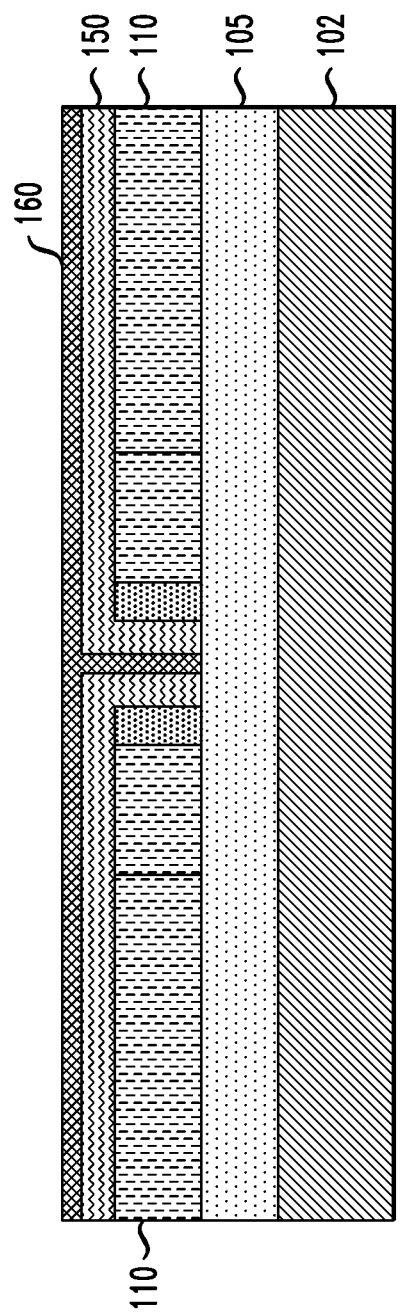
FIG. 6 is cross-sectional view illustrating deposition of a dielectric material, according to an exemplary embodiment of the present invention.

FIG. 6 is cross-sectional view illustrating deposition of a dielectric material, according to an exemplary embodiment of the present invention. Referring to FIG. 6, according to an embodiment, the dielectric layer 160 includes, but is not necessarily limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The dielectric layer 160 can be deposited using deposition techniques including, but not limited to, CVD, PECVD, RFCVD, PVD, ALD, MBD, pulsed laser deposition, and/or LSMCD, sputtering, and/or plating. As shown in FIG. 6, the dielectric layer 160 is deposited on exposed portions of the silicide layer 150, and fills the gap G between the portions of the silicide layer 150 on the left and right epitaxial layers 130.

FIGS. 7A and 7B are respective top and cross-sectional views illustrating removal of part of the dielectric layer and formation of contacts, according to an exemplary embodiment of the present invention. FIG. 7B is a cross-sectional view taken along line D-D' in FIG. 7A. Referring to FIGS. 7A and 7B, portions of the dielectric layer 160 on the top surface of the silicide layer 150 and on top of the part of the dielectric layer 160 filling in the gap between the portions of the silicide layer 150 on the left and right epitaxial layers 130 are removed using, for example, an anisotropic etch process, such as reactive ion etching (RIE), ion beam etching, plasma etching or laser ablation. As a result, the part of the dielectric layer 160 filling in the gap between the portions of the silicide layer 150 remains to form the anti-fuse structure including the dielectric layer 160 between the portions of the silicide layer 150 on the left and right epitaxial layers 130.

In addition, portions of the silicide region 150 over the pads 110 are removed using, for example, SPM or aqua regia, to expose parts of the pads 110. In an alternative embodiment, the dielectric layer 160 is not removed prior to removing the portions of the silicide region to expose the parts of the pads 110 that will be contacted by conductive contacts, such as metal contacts 170. In this case, portions of the dielectric layer 160 are removed during removal of the portions of the silicide region 150.

Metal contacts 170 contacting the exposed portions of the pads 110 are formed to fill-in vias in the silicide layer 150 left by the removal process. As shown in FIG. 7B, the contacts 170 extend to a height over the upper surface of the silicide layer 150. Also, as shown in FIG. 7A, a plurality of such contacts 170 can be formed on each pad 110. The contacts 170 can include, for example, tungsten, cobalt, ruthenium, copper, or combinations thereof, and may be formed using, for example, deposition techniques including, but not limited to, CVD, PECVD, RFCVD, PVD, ALD, MBD, pulsed laser deposition, and/or LSMCD, sputtering, and/or plating.

In order to program/activate the anti-fuse structure, a voltage is applied to the dielectric layer 160 between the portions of the silicide layer 150 on the left and right epitaxial layers 130 via the contacts 170, conductive pads and fin 110, 112, and the silicide and epitaxial layers 150 and 130. The applied voltage reduces the resistance of the dielectric layer 160, thereby programming/activating the anti-fuse structure.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a substrate;
   a first pad and a second pad on the substrate, wherein the first and second pads are spaced apart from each other;
   a first fin part on the substrate and extending from the first pad in a direction toward the second pad;
   a second fin part on the substrate and extending from the second pad in a direction toward the first pad;
   first and second epitaxial layers on the substrate and respectively extending from and positioned between the first and second fin parts;
   first and second silicide layers on the substrate and respectively on each of the first and second epitaxial layers and positioned between the first and second fin parts;
   a gap between the first and second silicide layers; and
   a dielectric layer on the substrate and filling the gap between the first and second silicide layers.

2. The semiconductor device according to claim 1, wherein the first and second silicide layers are further positioned on respective top surfaces of the first and second pads, and on respective top surfaces of the first and second fin parts.

3. The semiconductor device according to claim 2, wherein the first and second silicide layers are further positioned on respective top surfaces of the first and second epitaxial layers.

4. The semiconductor device according to claim 1, wherein the first and second fin parts have a same height above the substrate as the first and second pads.

5. The semiconductor device according to claim 1, wherein the first and second epitaxial layers have a same height above the substrate as the first and second fin parts.

6. The semiconductor device according to claim 1, wherein the first and second epitaxial layers have a same height above the substrate as the first and second pads.

7. The semiconductor device according to claim 1, wherein the first and second silicide layers comprise at least one of nickel silicide (NiSi), nickel platinum silicide (NiPt$_y$Si$_x$), cobalt silicide (CoSi$_x$), tantalum silicide (TaSi$_x$) and titanium silicide (TiSi$_x$).

8. The semiconductor device according to claim 1, wherein the dielectric layer comprises a low-K dielectric material.

9. The semiconductor device according to claim 1, further comprising:
   a first conductive contact formed on and contacting the first pad; and a second conductive contact formed on and contacting the second pad.

10. The semiconductor device according to claim 1, wherein the first and second pads each have a larger width than the first and second fin parts between top and bottom surfaces in a top view.

11. A semiconductor device, comprising:
a substrate;
a first fin part and a second fin part on the substrate, wherein the first and second fin parts are spaced apart from each other;
first and second epitaxial layers on the substrate and respectively extending from and positioned between the first and second fin parts;
first and second silicide layers on the substrate and respectively on each of the first and second epitaxial layers and positioned between the first and second fin parts;
a gap between the first and second silicide layers; and
a dielectric layer on the substrate and filling the gap between the first and second silicide layers;
wherein the first and second fin parts respectively extend from a first pad and a second pad formed on the substrate.

12. The semiconductor device according to claim 11, wherein the first and second silicide layers are further positioned on respective top surfaces of the first and second fin parts.

13. The semiconductor device according to claim 12, wherein the first and second silicide layers are further positioned on respective top surfaces of the first and second epitaxial layers.

14. The semiconductor device according to claim 11, wherein the first and second epitaxial layers have a same height above the substrate as the first and second fin parts.

15. The semiconductor device according to claim 11, wherein the first and second silicide layers comprise at least one of nickel silicide (NiSi), nickel platinum silicide (NiP$_{t_y}$Si$_x$), cobalt silicide (CoSi$_x$), tantalum silicide (TaSi$_x$) and titanium silicide (TiSi$_x$).

16. The semiconductor device according to claim 11, wherein the dielectric layer comprises a low-K dielectric material.

17. The semiconductor device according to claim 11, further comprising:
a first conductive contact formed on and contacting the first pad; and
a second conductive contact formed on and contacting the second pad.

18. The semiconductor device according to claim 11, wherein the first and second pads each have a larger width than the first and second fin parts between top and bottom surfaces in a top view.

19. The semiconductor device according to claim 11, wherein the first and second fin parts have a same height above the substrate as the first and second pads.

* * * * *